(12) United States Patent
An

(10) Patent No.: US 8,027,190 B2
(45) Date of Patent: Sep. 27, 2011

(54) COMMAND PROCESSING CIRCUIT AND PHASE CHANGE MEMORY DEVICE USING THE SAME

(75) Inventor: Yong-Bok An, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 185 days.

(21) Appl. No.: 12/489,690

(22) Filed: Jun. 23, 2009

(65) Prior Publication Data

US 2010/0290266 A1 Nov. 18, 2010

(30) Foreign Application Priority Data

May 15, 2009 (KR) .................. 10-2009-0042597

(51) Int. Cl.
*G11C 11/00* (2006.01)
*G11C 8/00* (2006.01)
(52) U.S. Cl. ........ 365/163; 365/148; 365/158; 365/175; 365/230.06; 365/230.08; 365/233.1
(58) Field of Classification Search ............. 365/189.05, 365/230.06, 230.08, 233.1, 148, 158, 163, 365/175
See application file for complete search history.

(56) References Cited

U.S. PATENT DOCUMENTS

| 7,471,554 | B2 * | 12/2008 | Spall et al. | 365/163 |
| 7,471,556 | B2 * | 12/2008 | Chow et al. | 365/163 |
| 7,606,111 | B2 * | 10/2009 | Lee et al. | 365/163 |
| 7,894,232 | B2 * | 2/2011 | Hanzawa et al. | 365/163 |

FOREIGN PATENT DOCUMENTS

| KR | 1020010013744 | 2/2001 |
| KR | 100718038 | 5/2007 |

OTHER PUBLICATIONS

Notice of Allowance issued from Korean Intellectual Property Office on Nov. 30, 2010.

* cited by examiner

*Primary Examiner* — Trong Phan
(74) *Attorney, Agent, or Firm* — IP & T Group LLP

(57) ABSTRACT

A command processing circuit for generating internal command signals corresponding to a plurality of unit internal command signals sequentially applied during a plurality of command cycles, the command processing circuit includes a first command latching unit configured to latch a first unit internal command signal applied in a first command cycle and a second command latching unit configured to latch a second unit internal command signal in response to the first unit internal command signal latched in the first command latching unit in a second command cycle after the first command cycle, and output an internal command signal corresponding to the first unit internal command signal and the second unit internal command signal.

26 Claims, 8 Drawing Sheets

FIG. 1

| Command Definitions | | Cycle | 1st Cycle | 2nd Cycle | 3rd Cycle | 4th Cycle | 5th Cycle | 6th Cycle |
|---|---|---|---|---|---|---|---|---|
| Asynchronous Read | Add | 1 | RA | | | | | |
| | Data | | RD | | | | | |
| Reset | Add | 1 | XXXH | | | | | |
| | Data | | F0H | | | | | |
| Autoselect Manufacturer | Add | 4 | 555H | 2AAH | (DA)555H | (DA)X00H | | |
| | Data | | AAH | 55H | 90H | ECH | | |
| Autoselect Device ID | Add | 4 | 555H | 2AAH | (DA)555H | (DA)X01H | | |
| | Data | | AAH | 55H | 90H | Note 6 | | |
| Autoselect Block Protection Verify | Add | 4 | 555H | 2AAH | (BA)555H | (BA)X02H | | |
| | Data | | AAH | 55H | 90H | 00H/01H | | |
| Program | Add | 4 | 555H | 2AAH | 555H | PA | | |
| | Data | | AAH | 55H | A0H | PD | | |
| Unlock Bypass | Add | 3 | 555H | 2AAH | 555H | | | |
| | Data | | AAH | 55H | 20H | | | |
| Unlock Bypass Program | Add | 2 | XXX | PA | | | | |
| | Data | | A0H | PD | | | | |

COMMAND PROCESSING CIRCUIT AND PHASE CHANGE MEMORY DEVICE USING THE SAME

CROSS-REFERENCE(S) TO RELATED APPLICATIONS

The present application claims priority of Korean Patent Application No. 10-2009-0042597, filed on May 15, 2009, the disclosure of which is incorporated herein by reference in its entirety.

BACKGROUND OF THE INVENTION

The present invention relates to a semiconductor design technology, and more particularly, to a command processing circuit for processing a command sequence.

Memory devices such as a phase change memory device perform internal operations (programming operation, read operation, and so on) according to a command sequence. According to a command sequence method, a specific internal operation state is determined according to a plurality of unit command codes that are sequentially inputted during a plurality of command cycles. Therefore, the phase change memory device includes a command processing circuit for processing the command sequence. A command processing circuit generates an internal command signal corresponding to a command sequence. The internal command signal is a flag signal indicating that the memory device is in a corresponding internal operation state. Since the command processing circuit may influence an entire operation stability of the phase change memory device, it is important to design the internal command processing circuit that operates efficiently and stably.

SUMMARY OF THE INVENTION

An embodiment of the present invention is directed to providing a command processing circuit capable of more stably generating an internal command signal corresponding to a command sequence.

Another embodiment of the present invention is directed to providing a command processing circuit capable of reducing a layout area of an entire circuit.

Another embodiment of the present invention is directed to providing a phase change memory device including a command processing circuit capable of more stably generating an internal command signal corresponding to a command sequence and reducing a layout area of an entire circuit.

In accordance with an aspect of the present invention, there is provided a command processing circuit, which receives command sequences applied during a plurality of command cycles, the command sequences including a plurality of unit command codes corresponding to each command cycle, and generates internal command signals corresponding to the command sequences, the command processing circuit comprising a unit internal command signal generating unit configured to generate unit internal command signals corresponding to the unit command codes, a common command latching unit configured to latch the unit internal command signals corresponding to those of the unit command codes that are commonly contained in first and second command sequences, a first command latching unit configured to latch the unit internal command signal corresponding to the unit command code contained only in the first command sequence, and output a first internal command signal corresponding to the unit internal command signal latched in the common command latching unit and the unit internal command signal latched in the first command latching unit and a second command latching unit configured to latch the unit internal command signal corresponding to the unit command code contained only in the second command sequence, and output a second internal command signal corresponding to the unit internal command signal latched in the common command latching unit and the unit internal command signal latched in the second command latching unit.

In accordance with another aspect of the present invention, there is provided a command processing circuit for generating internal command signals corresponding to a plurality of unit internal command signals sequentially applied during a plurality of command cycles, the command processing circuit comprising a first command latching unit configured to latch a first unit internal command signal applied in a first command cycle and a second command latching unit configured to latch a second unit internal command signal in response to the first unit internal command signal latched in the first command latching unit in a second command cycle after the first command cycle, and output an internal command signal corresponding to the first unit internal command signal and the second unit internal command signal, wherein the first and second command latching units are configured to latch the unit internal command signals applied in the corresponding command cycles and further configured to not latch a signal applied to the respective latching unit when a predefined signal is in a latched state within the respective latching unit.

In accordance with another aspect of the present invention, there is provided a phase change memory device, which receives command sequences applied during a plurality of command cycles, the command sequences including a plurality of unit command codes corresponding to a respective command cycle, and generates internal command signals corresponding to the command sequences, the phase change memory device comprising a first decoding unit configured to decode unit command codes sequentially applied from outside of the phase memory device to output unit internal command signals corresponding to the unit command codes, a second decoding unit configured to decode command control codes applied from the outside to output an internal control signal corresponding to the unit command codes and a command processing unit configured to latch, in response to the internal control signal, unit internal command signals corresponding to those of the unit command codes that are commonly contained in the command sequences, in common command latching units and latch unit internal command signals corresponding to the unit command sequences contained only in the corresponding command sequences among the plurality of command sequences, in command latching units allocated to the corresponding command sequences, and output the plurality of internal command signals corresponding to the signals latched in the common command latching units and the signals latched in the command latching units allocated to the command sequences.

BRIEF DESCRIPTION OF THE DRAWINGS

FIG. 1 illustrates a command sequence table.

DESCRIPTION OF SPECIFIC EMBODIMENTS

Figure 2:
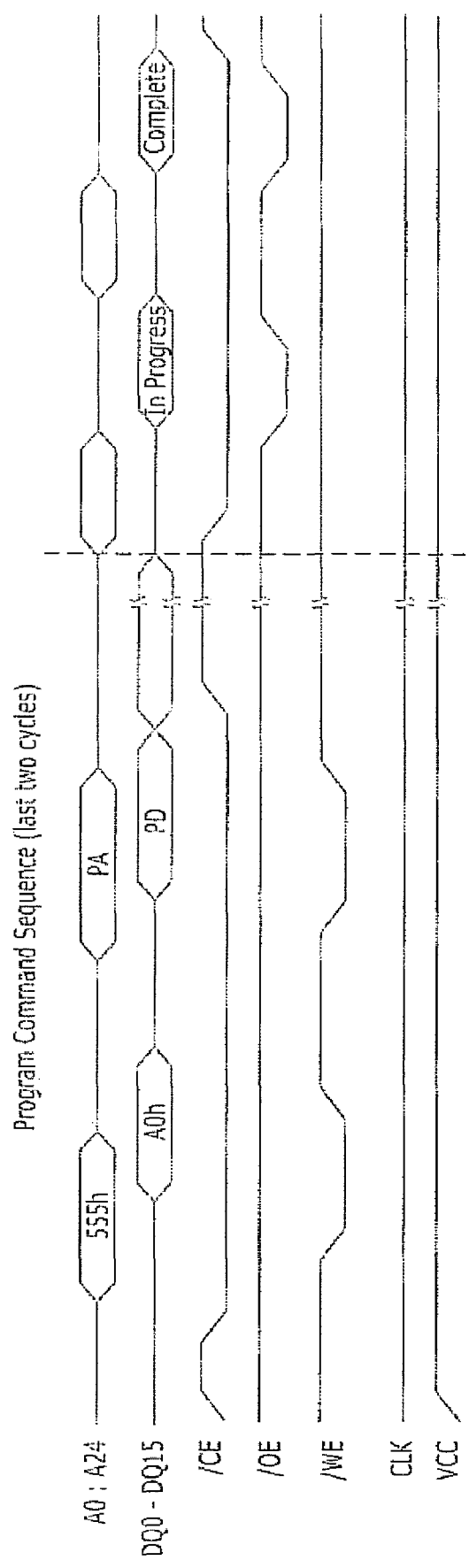
FIG. 2 is a timing diagram of a program command sequence.

Other objects and advantages of the present invention can be understood by the following description, and become apparent with reference to the embodiments of the present invention. In the drawings and detailed description, since the terms, numerals, and symbols used to indicate devices or blocks may be expressed by sub-units, it should be noted that the same terms, numerals, and symbols may not indicate the same devices in a whole circuit.

Generally, logic signals of a circuit have a high level (H) and a low level (L) according to a voltage level and may be represented by "1" and "0." It will be assumed that, if necessary, the logic signals may have a high impedance (Hi-Z) state. Furthermore, data values of data signals may be differentiated according to a voltage level and a current magnitude and expressed in a single bit or multi bit form.

FIG. 1 illustrates a command sequence table.

Referring to FIG. 1, "asynchronous read" and "reset" command Sequences (address Add and data Data) in "Command Definitions" fields are defined as a 1-cycle unit command code, and an "unlock bypass program" command sequence is defined as a 2- cycle unit command code. An "unlock bypass" command sequence is defined as a 3-cycle unit command code. The remaining command sequences including a "program" command sequence are defined as a 4-cycle unit command code. It can be seen that some command sequences may be constituted with common unit command codes. For example, the unit command codes 555h, AAh, 2AAh and 55h of the first and second cycles of the "program" command sequence are identical to the unit command codes 555h, AAh, 2AAh and 55h of the first and second cycles of the "unlock bypass", "autoselect manufacturer", "autoselect device ID" and "autoselect block protection verify" command sequences. The other command sequences are constituted with certain unit command codes. For example, the "asynchronous read" command sequence includes the unit command codes RA(Add) and RD(Data)in the first cycle. The "reset" command sequence includes the unit command codes XXXH(Add) and FOH (Data) in the first cycle. The "autoselect manufacturer" command sequence includes the unit command codes (DA)555H (Add) and 90H (Data) in the third cycle, and the unit command codes (DA)X00H(Add)and ECH(Data) in the fourth cycle. The "autoselect device ID" command sequence includes the unit commnad codes(DA) 555H (Add) and 90(Data) in the third cycle, and the unit command codes(DA)X01H (Add) and note 6(Data) in the fourth cycle. The "autoselect block protection verify" Command sequence includes the unit command codes (BA)555H (Add) and 90H (Data) in the third cycle, and the unit command codes (BA)X02H (Add) and 00H/01H(Data)in the fourth cycle. The "program" command sequence includes the unit command codes 555H(Add) and A0H (Data) in the third cycle, and the unit command codes PA (Add) and PD (Data) in the fourth cycle. The "unlock bypass" command sequence includes the unit command codes 555H (Add) and 20H (Data) in the third cycle. The "unlock bypass program" command sequence includes the unit command codes XXX (Add) and A0H (Data) in the first cycle, and the unit command codes PA (Add) and PD (Data) in the second cycle. No command sequences in the fifth cycle and the sixth cycle are constituted with any unit command codes. A command processing circuit for efficiently processing the common unit command codes contained in a plurality of command sequences will be described below.

FIG. 2 is a timing diagram of a program command sequence.

An internal operation of the command processing circuit according to the program command sequence will be described below with reference to FIG. 2.

The unit command codes are applied through address channels A0:A24 and data channels DQ0:DQ15. The unit command codes inputted at the first and second cycles of the program command sequence are omitted, and the unit command codes inputted at the last two cycles of the program command sequence are illustrated. For example, the unit command codes PA and PD inputted after the unit command codes 555H (555h) and A0H (A0h) of the third cycle are illustrated. At this time, an inter control signal (or clock) CLK and a power supply voltage VCC are provided. After the internal operation of the program command sequence, a data read operation will be in progress and completed.

The unit command codes of the program command sequence are inputted under the control of command control codes applied through the control channels, for example, a chip enable signal /CE, a write enable signal /WE, and an output enable signal /OE. That is, the write enable signal /WE acts as a strobe signal for processing the unit command codes. Therefore, the unit command codes are inputted in synchronization with the write enable signal /WE, and the unit command codes 555h and A0h of the third cycle and the unit command codes PA and PD of the fourth cycle are inputted in synchronization with the write enable signal /WE. An internal operation state with respect to the program operation is defined by the unit command codes 555h and A0h of the third cycle, and the unit command codes PA and PD inputted at the fourth cycle are a program address PA and a program data PD.

Hereinafter, a circuit for efficiently processing the command sequence containing the common unit command codes will be described in detail.

Figure 3:
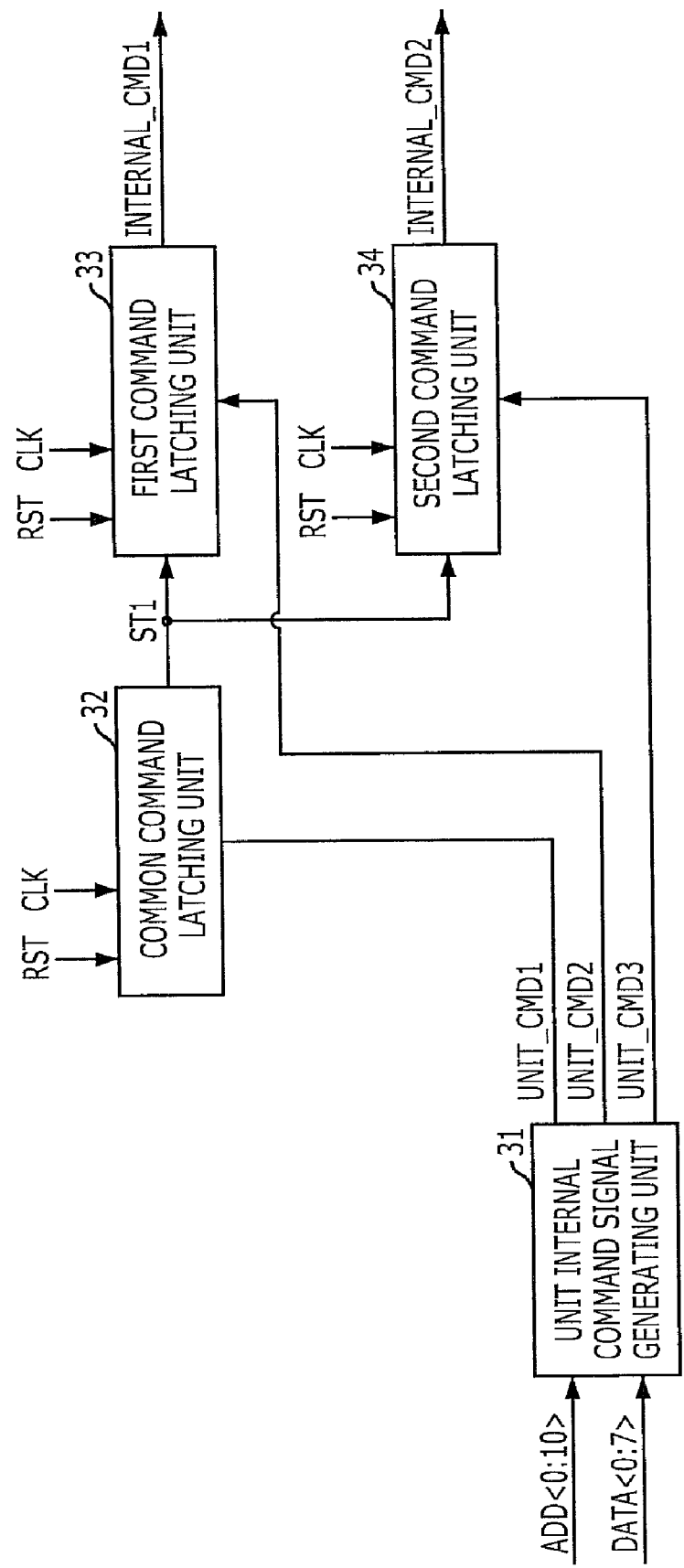
FIG. 3 is a block diagram of a command processing circuit in accordance with a first embodiment of the present invention.

FIG. 3 is a block diagram of a command processing circuit in accordance with a first embodiment of the present invention.

Referring to FIG. 3, the command processing circuit receives command sequences, which are applied during a plurality of command cycles and include a plurality of unit command codes corresponding to each command cycle, and generates an internal command signal INTERNAL_CMDi corresponding to the command sequences. The command processing circuit includes a unit internal command signal generating unit 31, a common command latching unit 32, a first command latching unit 33, and a second command latching unit 34. The unit internal command signal generating unit 31 receives command sequences including address ADD<0: 10>and data DATA<0:7>, and generates a unit internal command signal UNIT_CMDi corresponding to each unit command code. The common command latching unit 32 latches the unit internal command signal UNIT_CMDi corresponding to the unit command code commonly contained in a first command sequence and a second command sequence. The first command latching unit 33 latches a unit internal command signal UNIT_CMD2 corresponding to the unit command code contained only in the first command sequence, and outputs a first internal command signal INTERNAL_CMD1 corresponding to the unit internal command signal UNIT_CMD1 latched in the common command latching unit 32 and the unit internal command signal UNIT_CMD2 latched in the first command latching unit 33. The second command latching unit 34 latches a unit internal command signal UNIT_CMD3 corresponding to the unit command code contained only in the second command sequence, and outputs a second internal command signal INTERNAL_CMD2 corresponding to the unit internal command signal UNIT_CMD1 latched in the common command latching unit 32 and the unit internal command signal UNIT_CMD3 latched in the second command latching unit 34.

The internal operation of the command processing circuit will be described below in detail.

The unit internal command signal generating unit 31 generates the unit internal command signals UNIT_CMD1, UNIT_CMD2 and UNIT_CMD3 corresponding to the unit command codes applied sequentially through the address channels A0:A24 and the data channels DQ0:DQ15.

First, the operation when the first command sequence is applied will be described.

The first command sequence is defined as a 2-cycle unit command code. The first unit internal command signal UNIT_CMD1 corresponding to the unit command code applied during the first cycle is latched in the common command latching unit 32. Also, the second unit internal command signal UNIT_CMD2 corresponding to the unit command code applied during the second cycle is latched in the first command latching unit 33. Finally, the first internal command signal INTERNAL_CMD1 corresponding to the signals latched in the common command latching unit 32 and the first command latching unit 33 is generated. The first command latching unit 33 latches the second unit internal command signal UNIT_CMD2 in response to the signal ST1 latched in the common command latching unit 32. That is, when the first unit internal command signal UNIT_CMD1 is latched in the common command latching unit 32, the first command latching unit 33 latches the second unit internal command signal UNIT_CMD2. Thus, the first internal command signal INTERNAL_CMD1 can be generated more accurately.

Next, the operation when the second command sequence is applied will be described.

The second command sequence is defined as a 2-cycle unit command code. The first unit internal command signal UNIT_CMD1 corresponding to the unit command code applied during the first cycle is latched in the common command latching unit 32. Also, the third unit internal command signal UNIT_CMD3 corresponding to the unit command code applied during the second cycle is latched in the second command latching unit 34. Finally, the second internal command signal INTERNAL_CMD2 corresponding to the signals latched in the common command latching unit 32 and the second command latching unit 34 is generated. The second command latching unit 34 latches the third unit internal command signal UNIT_CMD3 in response to the signal ST1 latched in the common command latching unit 32. That is, when the first unit internal command signal UNIT_CMD1 is latched in the common command latching unit 32, the second command latching unit 34 latches the third unit internal command signal UNIT_CMD3. Thus, the second internal command signal INTERNAL_CMD2 can be generated more accurately.

In the command processing circuit in accordance with the first embodiment of the present invention, when generating the first internal command signal INTERNAL_CMD1 corresponding to the first command sequence or the second internal command signal INTERNAL_CMD2 corresponding to the second command sequence, the first unit internal command signal UNIT_CMD1 corresponding to the unit command code commonly contained in the first and second command sequences is latched in the common command latching unit 32. The unit internal command signal UNIT_CMDi corresponding to the unit command code contained only in the first command sequence or the second command sequence is latched in the first command latching unit 33 or the second command latching unit 34. In this way, the number of the required command latching units can be reduced.

Furthermore, when the first unit internal command signal UNIT_CMD1 is latched in the common command latching unit 32, the first command latching unit 33 or the second command latching unit 34 latches the applied signal and generates the corresponding internal command signal INTERNAL_CMDi, thereby providing a more stable operation. That is, when the first unit internal command signal UNIT_CMD1 is not latched in the common command latching unit 32 due to errors, the internal command signal INTERNAL_CMDi is not generated through the use of the signal latched in the first command latching unit 33 or the second command latching unit 34.

Moreover, after the common command latching unit 32 latches the first unit internal command signal UNIT_CMD1 during the first cycle, that is, the predefined signal is in the latched state, it does not latch a new signal. Also, after the first and second command latching units 33 and 34 latch the second unit internal command signal UNIT_CMD2 or the third unit internal command signal UNIT_CMD3 during the second cycle, that is, the predefined signal is in the latched state, it does not latch a new signal. By latching the signals in such a manner, it is possible to prevent an error that generates other internal command signals, instead of the predefined internal command signal INTERNAL_CMDi, due to noises or the like.

Figure 4:
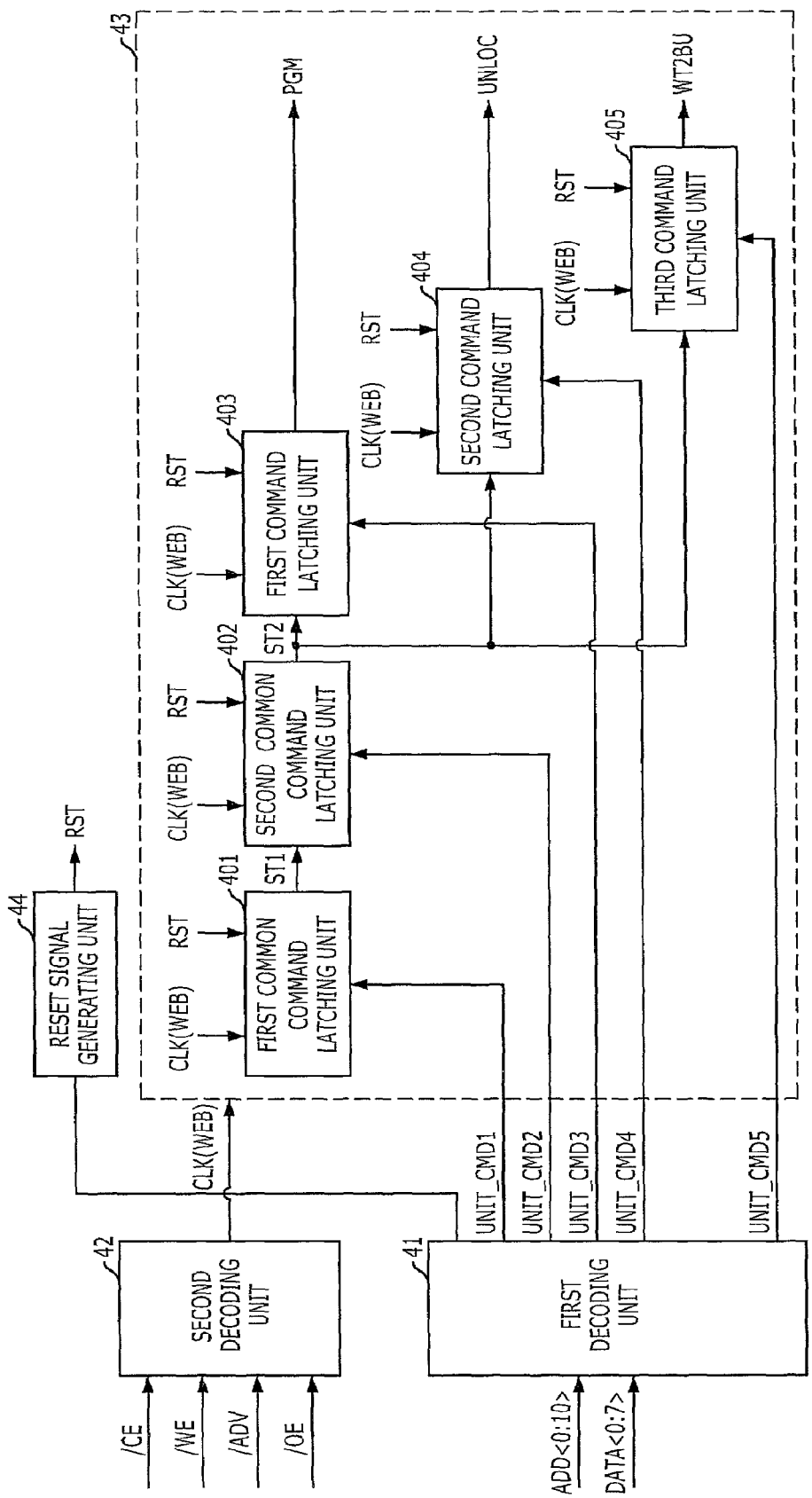
FIG. 4 is a block diagram of a phase change memory device in accordance with a second embodiment of the present invention.

FIG. 4 is a block diagram of a phase change memory device in accordance with a second embodiment of the present invention.

Referring to FIG. 4, the phase change memory device receives command sequences, which are applied during a plurality of command cycles and include a plurality of unit command codes corresponding to each command cycle, and generates internal command signals PGM, UNLOC and WT2BU corresponding to the command sequences. The phase change memory device includes a first decoding unit 41, a second decoding unit 42, and a command processing unit 43. The first decoding unit 41 decodes unit command codes sequentially applied from the outside to output a unit internal command signal UNIT_CMDi corresponding to each unit command code. The second decoding unit 42 decodes command control codes /CE, /WE, /ADV and /OE sequentially applied from the outside to output an internal control signal CLK(WEB). The command processing unit 43 latches unit internal command signals UNIT_CMD1 and UNIT_CMD2 corresponding to the unit command codes commonly contained in the command sequences, in common command latching units 401 and 402, in response to the internal control signal CLK(WEB), and latches unit internal command signals UNIT_CMD3, UNIT_CMD4 and UNIT_CMD5 corresponding to the unit command sequences contained only in the corresponding command sequences, in command latching units 403, 404 and 405 allocated to the corresponding command sequences, and outputs the plurality of internal command signals PGM, UNLOC and WT2BU corresponding to the signals latched in the common command latching units 401 and 402 and the signals latched in the command latching units 403, 404 and 405 allocated to the command sequences. The phase change memory device may further include a reset signal generating unit 44 that generates a reset signal RST for resetting the command processing unit 43 in response to the internal control signal CLK(WEB) and the unit internal command signal UNIT_CMD1 outputted from the first decoding unit 41.

The detailed structure and operation of the phase change memory device will be described below.

The first decoding unit 41 receives command sequences including address ADD<0:10>and data DATA<0:7>, and generates the unit internal command signals UNIT_CMD0 to UNIT_CMD5 by decoding the unit command codes sequentially applied from the outside through the address channels A0:A24 and the data channels DQ0 to DQ15.

The second decoding unit 42 decodes the command control codes /CE, /WE, /ADV and /OE applied from the outside through the control channels to output the internal control code CLK(WEB). The command control codes /CE, /WE, /ADV and /OE include a chip enable signal, a write enable signal, an address valid input signal, and an output enable signal. Furthermore, the internal control signal CLK(WEB) is defined as a type of an internal clock signal or a strobe signal.

The command processing unit 43, that is, the command processing circuit, includes the common command latching units 401 and 402, the first command latching unit 403, the second command latching unit 404, and the third command latching unit 405. The common command latching units 401 and 402 latch the first and second unit internal command signals UNIT_CMD1 and UNIT_CMD2 corresponding to the unit command codes commonly contained in the first and second command sequences in response to the internal control signal CLK(WEB). The first command latching unit 403 latches the third unit internal command signal UNIT_CMD3 corresponding to the unit command code contained only in the first command sequence in response to the internal control signal CLK(WEB), and outputs the first internal command signal PGM corresponding to the unit internal command signals latched in the common command latching units 401 and 402 and the third unit internal command signal UNIT_CMD3 latched in the first command latching unit 403. The second command latching unit 404 latches the fourth unit internal command signal UNIT_CMD4 corresponding to the unit command code contained only in the second command sequence in response to the internal control signal CLK(WEB), and outputs the second internal command signal UNLOC corresponding to the unit internal command signals latched in the common command latching units 401 and 402 and the fourth unit internal command signal UNIT_CMD4 latched in the second command latching unit 404. The third command latching unit 405 latches the fifth unit internal command signal UNIT_CMD5 corresponding to the unit command code contained only in the third command sequence in response to the internal control signal CLK(WEB), and outputs the third internal command signal WT2BU corresponding to the unit internal command signals latched in the common command latching units 401 and 402 and the fifth unit internal command signal UNIT_CMD5 latched in the third command latching unit 405.

In the command processing unit 43, when generating the first internal command signal PGM corresponding to the first command sequence, the second internal command signal UNLOC corresponding to the second command sequence, or the third internal command signal WT2BU corresponding to the third command sequence, the first and second unit internal command signals UNIT_CMD1 and UNIT_CMD2 corresponding to the unit command codes commonly contained in the first to third command sequences are latched in the common command latching units 401 and 402. The third to fifth unit internal command signals UNIT_CMD3 to UNIT_CMD5 corresponding to the unit command codes contained only in the corresponding command sequence among the first to third command sequences are latched in the first command latching unit 403, the second command latching unit 404, and the third command latching unit 405, respectively. In this way, the number of the required command latching units can be reduced.

Upon the internal operation according to the first command sequence, the second common command latching unit 402 latches the second unit internal command signal UNIT_CMD2 applied when the first unit internal command signal UNIT_CMD1 is latched in the first common command latching unit 401, and the first command latching unit 403 latches the third unit internal command signal UNIT_CMD3 applied when the second unit internal command signal UNIT_CMD2 is latched in the second common command latching unit 402. Then, the first internal command signal PGM is generated and thus the operation is more stable. That is, when the corresponding unit internal command signals UNIT_CMDi are not latched in the first common command latching unit 401 and/or the second common command latching unit 402 due to errors, the first internal command signal PGM is not generated through the use of the third unit internal command signal UNIT_CMD3 latched in the first command latching unit 403. For reference, the first command sequence is the "PGM" command sequence, and the first internal command signal PGM is a flag signal indicating that the memory device is in a corresponding internal operation state due to the "PGM" command sequence.

Upon the internal operation according to the second command sequence, the second common command latching unit 402 latches the second unit internal command signal UNIT_CMD2 applied when the first unit internal command signal UNIT_CMD1 is latched in the first common command latching unit 401, and the second command latching unit 404 latches the fourth unit internal command signal UNIT_CMD4 applied when the second unit internal command signal UNIT_CMD2 is latched in the second common command latching unit 402. Then, the second internal command signal UNLOC is generated and thus the operation is more stable. That is, when the corresponding unit internal command signals UNIT_CMDi are not latched in the first common command latching unit 401 and/or the second common command latching unit 402 due to errors, the second internal command signal UNLOC is caused to not be generated by use of the fourth unit internal command signal UNIT_CMD4, which is latched in the first command latching unit 403. For reference, the second command sequence is the "UNLOC" command sequence, and the second internal command signal UNLOC is a flag signal indicating that the memory device is in a corresponding internal operation state due to the "UNLOC" command sequence.

In the internal operation according to the third command sequence, the second common command latching unit 402 latches the second unit internal command signal UNIT_CMD2 applied when the first unit internal command signal UNIT_CMD1 is latched in the first common command latching unit 401, and the third command latching unit 405 latches the fifth unit internal command signal UNIT_CMD5 applied when the second unit internal command signal UNIT_CMD2 is latched in the second common command latching unit 402. Then, the third internal command signal WT2BU is generated and thus the operation is more stable. That is, when the corresponding unit internal command signals UNIT_CMDi are not latched in the first common command latching unit 401 and/or the second common command latching unit 402 due to errors, the third internal command signal WT2BU is not generated through the use of the fifth unit internal command signal UNIT_CMD5 latched in the third command latching unit 405. For reference, the third command sequence is the "WT2BU" command sequence, and the third internal command signal WT2BU is a flag signal indicating that the memory device is in a corresponding internal operation state due to the "WT2BU" command sequence.

Moreover, upon the internal operation according to the first command sequence, after the first common command latching unit 401 latches the first unit internal command signal UNIT_CMD1 during the first cycle, that is, the predefined signal is in the latched state, it does not latch a new signal. Also, after the second command latching unit 402 latches the second unit internal command signal UNIT_CMD2 during the second cycle, that is, the predefined signal is in the latched state, it does not latch a new signal. Also, after the first command latching unit 403 latches the third unit internal command signal UNIT_CMD3 during the third cycle, that is, the predefined signal is in the latched state, it does not latch a new signal. By latching the signals in such a manner, it is possible to prevent an error that generates other internal command signals, instead of the first internal command signal PGM, due to noises or the like.

Moreover, upon the internal operation according to the second command sequence, after the first common command latching unit 401 latches the first unit internal command signal UNIT_CMD1 during the first cycle, that is, the predefined signal is in the latched state, it does not latch a new signal. Also, after the second command latching unit 402 latches the second unit internal command signal UNIT_CMD2 during the second cycle, that is, the predefined signal is in the latched state, it does not latch a new signal. Also, after the second command latching unit 404 latches the fourth unit internal command signal UNIT_CMD4 during the third cycle, that is, the predefined signal is in the latched state, it does not latch a new signal. By latching the signals in such a manner, it is possible to prevent an error that generates erroneous internal command signals, instead of the second internal command signal UNLOC, due to noises or the like.

Moreover, upon the internal operation according to the third command sequence, after the first common command latching unit 401 latches the first unit internal command signal UNIT_CMD1 during the first cycle, that is, the predefined signal is in the latched state, it does not latch a new signal. Also, after the second command latching unit 402 latches the second unit internal command signal UNIT_CMD2 during the second cycle, that is, the predefined signal is in the latched state, it does not latch a new signal. Also, after the third command latching unit 405 latches the fifth unit internal command signal UNIT_CMD5 during the third cycle, that is, the predefined signal is in the latched state, it does not latch a new signal. By latching the signals in such a manner, it is possible to prevent an error that generates other internal command signals, instead of the third internal command signal WT2BU, due to noises or the like.

Figure 5:
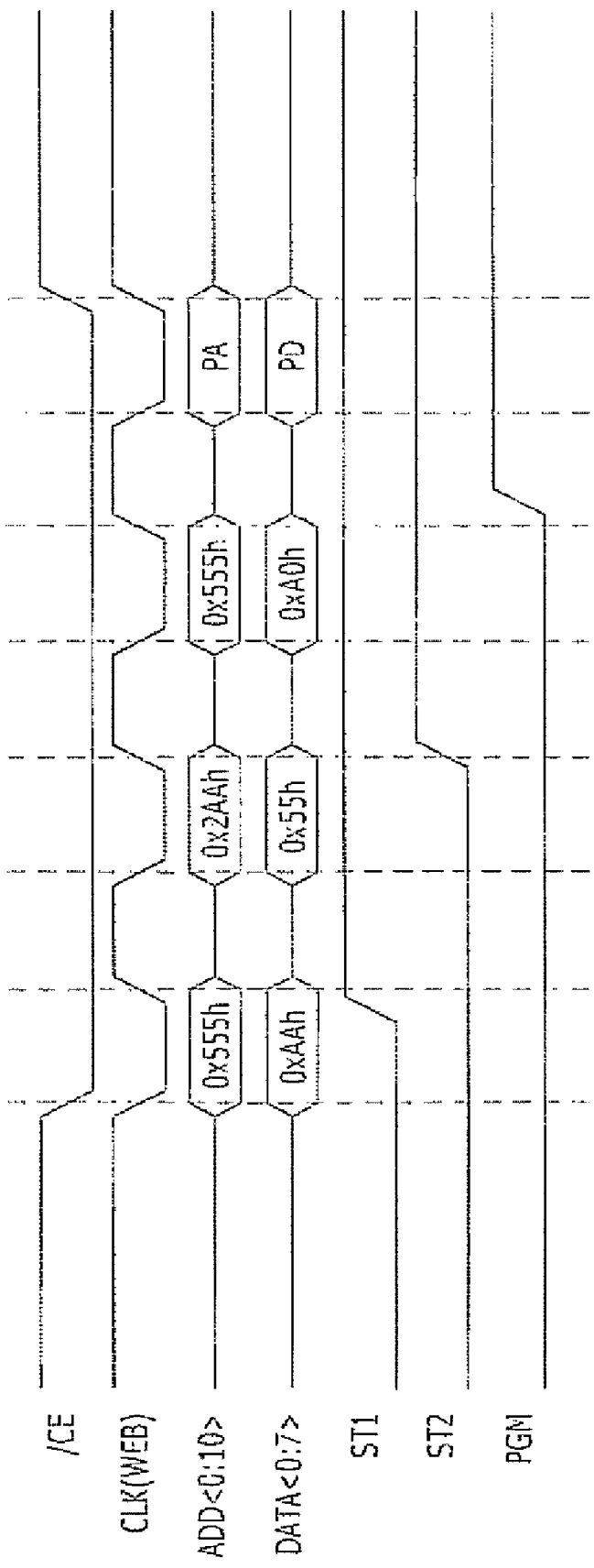
FIG. 5 is a timing diagram showing the internal operation of the phase change memory device of FIG. 4.

FIG. 5 is a timing diagram showing the internal operation of the phase change memory device of FIG. 4.

The internal operation of the phase change memory device according to the second embodiment of the present invention will be described below with reference to FIG. 5.

The unit command codes are inputted in synchronization with the internal control signal CLK(WEB) during the first to fourth cycles.

When the first unit command codes 0x555h (ADD<0:10>) and 0xAAh (DATA<0:7>) are applied in the first cycle, the first unit internal command signal corresponding to the first unit command codes 0x555h and 0xAAh is latched in the first common command latching unit 401 and the output signal ST1 of the first common command latching unit 401 is activated to high level.

When the second unit command codes 0x2AAh (ADD<0:10>) and 0x55H (DATA<0:7>) are applied in the second cycle, the second unit internal command signal corresponding to the second unit command codes 0x2AAh and 0x55h is latched in the second common command latching unit 402 and the output signal ST2 of the second common command latching unit 402 is activated to high level. If the output signal ST1 of the first common command latching unit 401 is not activated, the second common command latching unit 402 does not latch the second unit internal command signal.

When the third unit command codes 0x555h (ADD<0:10>) and 0xAAh (DATA<0:7>) are applied in the third cycle, the third unit internal command signal corresponding to the third unit command codes 0x555h and 0xA0h is latched in the first command latching unit 403, and the output signal PGM of the first command latching unit 403, that is, the flag signal indicating the program state, is activated to a high level. If the output signal ST2 of the second common command latching unit 402 is not activated, the first command latching unit 403 does not latch the second unit internal command signal.

The fourth unit command codes PA (ADD<0:10>) and PD (DATA<0:7>), that is, the program address and the program data, are applied in the fourth cycle.

Figure 6:
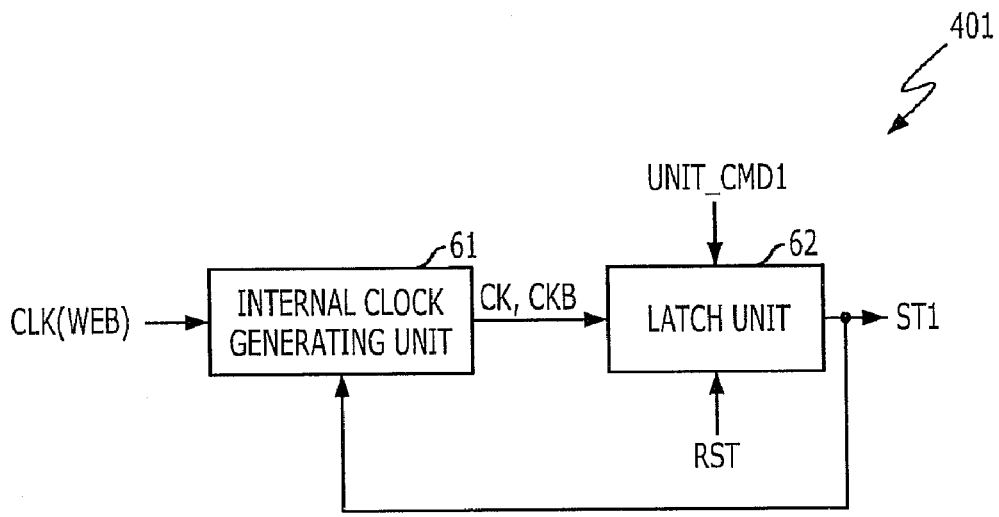
FIG. 6 is a block diagram of a command latching unit of FIG. 4.

FIG. 6 is a block diagram of the command latching unit of FIG. 4. Since the common command latching units 401 and 402, the first command latching unit 403, the second command latching unit 404, and the third command latching unit 405 have the same circuit configuration, the first common command latching unit 401 will be described as a representative example.

Referring to FIG. 6, the first common command latching unit 401 includes a latch unit 62 and an internal clock generating unit 61. The latch unit 62 latches the first unit internal command signal UNIT_CMD1 in response to the internal clock signals CK and CKB. The internal clock generating unit 61 generates the internal clock signals CK and CKB corresponding to the internal control signal CLK(WEB) in response to the output signal ST1 of the latch unit 62.

When the output signal ST1 of the latch unit 62 is not activated, that is, the signal is not latched in the latch unit 62, the internal clock generating unit 61 generates the internal clock signals CK and CKB toggling in response to the internal control signal CLK(WEB). The latch unit 62 latches the first unit internal command signal UNIT_CMD1 when the internal clock signals CK and CKB toggle. After the first unit internal command signal UNIT_CMD1 has been already latched, the internal clock signals CK and CKB that do not toggle and the latch unit 62 receives such internal clock signals CK and CKB. Therefore, the latch unit 62 does not latch a new signal until the latch unit 62 is reset by the reset signal RST.

The detailed structure and operation of the first common command latching unit 401 will be described below.

Figure 7:
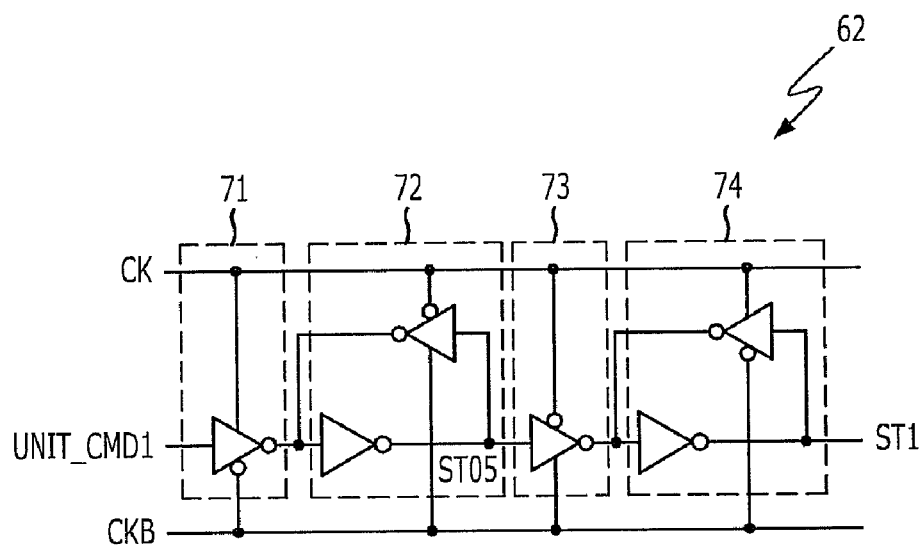
FIG. 7 is a circuit diagram of a latch unit of FIG. 6.

FIG. 7 is a circuit diagram of the latch unit of FIG. 6.

Referring to FIG. 7, the latch unit 62 includes a first signal transfer unit 71, a first latch 72, a second signal transfer unit 73, and a second latch 74. The first signal transfer unit 71 selectively transfers the unit internal command signal UNIT_CMD1 in response to the positive clock CK. The first latch 72 latches the output signal of the first signal transfer unit 71 in response to the negative clock CKB. The second signal transfer unit 73 selectively transfers the output signal of the first latch 72 in response to the negative clock CKB. The second latch 74 latches the output signal of the second signal transfer unit 73 in response to the positive clock CK.

Figure 8:
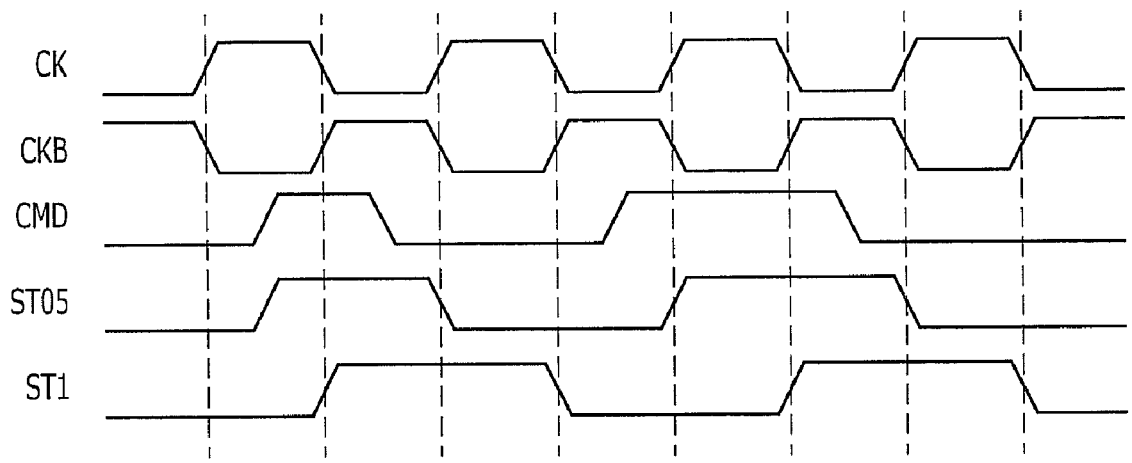
FIG. 8 is a timing diagram showing the internal operation of the latch unit.

FIG. 8 is a timing diagram showing the internal operation of the latch unit.

The operation of the latch unit 62 will be described with reference to FIG. 8.

When the positive clock CK is at a high level and the negative clock is at a low level, the first signal transfer unit 71 is enabled to transfer the unit internal command signal UNIT_CMD1. Therefore, a first node ST05 has a high level that is the same level as the unit internal command signal UNIT_CMD1.

When the positive clock CK is at a low level and the negative clock CKB is at a high level, the first signal transfer unit 71 is disabled so that it does not transfer the inputted signal. Also, since the first latch 72 is enabled, the first node ST05 is kept at the high level. Furthermore, since the second signal transfer unit 73 is enabled, the signal of the first node ST05 is transferred and the output signal of high level is finally outputted.

When the positive clock CK is at a high level and the negative clock CKB is at a low level, the second signal transfer unit 73 is disabled so that it does not transfer the signal. In this case, since the second latch 74 is enabled, the final output signal ST1 is kept at the high level.

For reference, FIG. 8 is a timing diagram showing the case where the above-mentioned operations are repeatedly performed. Only the operation of the latch unit 62 is illustrated, without considering the operation of the internal clock generating unit 61. Also, the common command latching units 401 and 402, the first command latching unit 403, the second command latching unit 404, and the third command latching unit 405 have the same circuit configuration. However, the latch unit of the second common command latching unit 402 further includes a signal transfer unit configured to receive the second unit internal command signal UNIT_CMD2 only when the output signal ST1 of the first common command latching unit 401 is activated. In addition, the latch units of the first to third command latching units 403 to 405 further include a signal transfer unit configured to receive the corresponding unit internal command signals UNIT_CMDi only when the output signal ST2 of the second common command latching unit 402 is activated.

Figure 9:
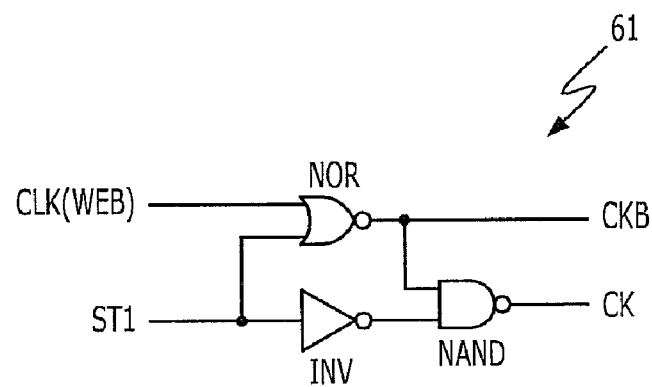
FIG. 9 is a circuit diagram of an internal clock generating unit of FIG. 6.

FIG. 9 is a circuit diagram of the internal clock generating unit of FIG. 6.

Referring to FIG. 9, the internal clock generating unit 61 includes a first logic NOR, a second logic INV, and a third logic NAND. The first logic NOR performs a NOR operation on the internal control signal CLK(WEB) and the output signal ST1 of the latch unit 62 to output the negative clock CKB. The second logic INV inverts the output signal ST1 of the latch unit 62. The third logic NAND performs a NAND operation on the output signal of the first logic NOR and the output signal of the second logic INV to output the positive clock CK. In the current embodiment, the first logic NOR, the second logic INV, and the third logic NAND are implemented with a NOR gate, an inverter, and a NAND gate, respectively.

Figure 10:
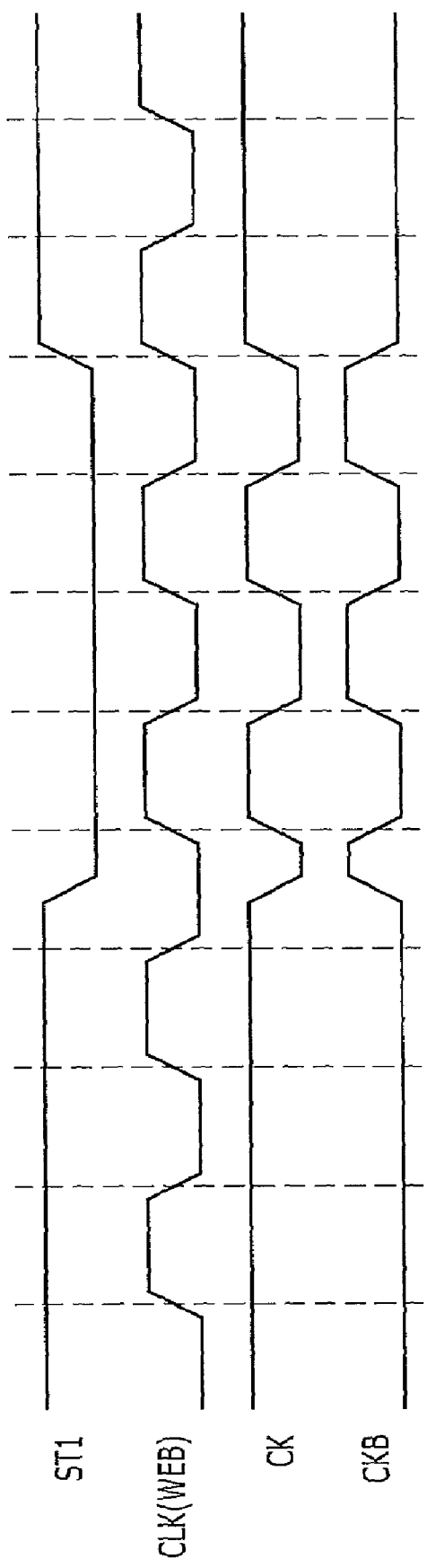
FIG. 10 is a timing diagram showing the internal operation of the internal clock generating unit.

FIG. 10 is a timing diagram showing the internal operation of the internal clock generating unit.

The operation of the internal clock generating unit 61 will be described below with reference to FIG. 10.

The internal control signal CLK(WEB) is a signal that continuously toggles, and it is inputted to a first input terminal of the first logic NOR. The internal control signal CLK (WEB) is inverted by the second logic INV and inputted to a first input terminal of the third logic NAND.

When the signal is latched in the latch unit 62, the latch unit 62 outputs a high level signal ST1. Thus, the negative clock CKB outputted from the first logic NOR is kept at a low level, and the positive clock CK outputted from the third logic NAND is kept at a high level.

When the signal is not latched in the latch unit 62, the latch unit 62 outputs a low level signal ST1. Thus, the negative clock CKB outputted from the first logic NOR and the positive clock CK outputted from the third logic NAND continuously toggle in response to the internal control signal CLK (WEB).

In summary, since the internal clock signals CK and CKB outputted from the internal clock generating unit 61 do not toggle when the signal is latched in the latch unit 62, the latch unit 62 does not latch a new signal. That is, since the internal clock signals CK and CKB outputted from the internal clock generating unit 61 toggle when the signal is not latched in the latch unit 62, the latch unit 62 can latch a signal.

In the command processing circuit and the phase change memory device latch in accordance with the embodiments of the present invention, the unit internal command signals corresponding to the unit command codes commonly contained in the plurality of command sequences are latched in the common command latching unit, thereby reducing the number of the required command latching units.

Moreover, since the internal command signals are generated by using the command latching unit that latches the unit internal command signal applied in the corresponding command cycle and does not latch the signal applied to the latch when the signal is already being latched, the internal command signals can be generated more stably. Therefore, it is possible to ensure the operational stability of the phase change memory device including the command processing circuit.

While the present invention has been described with respect to the specific embodiments, it will be apparent to those skilled in the art that various changes and modifications may be made without departing from the spirit and scope of the invention as defined in the following claims.

For example, although not directly related to the technical spirit of the present invention, embodiments including additional structures may be exemplified for further detailed description. Furthermore, the active high or active low structure representing the activation states of signals or circuits may be changed according to embodiments. Moreover, the configurations of the transistors may also be changed in order to implement the same functions. That is, the PMOS transistor and the NMOS transistor may be used interchangeably with each other and, if necessary, a variety of transistors may be used herein. Moreover, modifications can be made in the logic gate configurations in order to implement the same functions. That is, NAND units and NOR units may be implemented with various combinations of NAND gates, NOR gates, and inverters.

In particular, the number of the common command latching units and the command latching units provided in the command processing circuit or the phase change memory device may be changed according to embodiments. Furthermore, although the detailed circuit configurations of the common command latching units and the command latching units have not been illustrated in the first embodiment, it is apparent that they can easily be deduced from the detailed circuit configurations of the second embodiment by those skilled in the art. Numerous modifications can be made in the circuit configuration and can easily be deduced by those skilled in the art. Therefore, their enumeration will be omitted herein.

What is claimed is:

1. A command processing circuit, which receives command sequences applied during a plurality of command cycles, the command sequences including a plurality of unit command codes corresponding to each command cycle, and generates internal command signals corresponding to the command sequences, the command processing circuit comprising:
a unit internal command signal generating unit configured to generate unit internal command signals corresponding to the unit command codes;
a common command latching unit configured to latch the unit internal command signals corresponding to those of the unit command codes that are commonly contained in first and second command sequences;
a first command latching unit configured to latch the unit internal command signal corresponding to the unit command code contained only in the first command sequence, and output a first internal command signal corresponding to the unit internal command signal latched in the common command latching unit and the unit internal command signal latched in the first command latching unit; and
a second command latching unit configured to latch the unit internal command signal corresponding to the unit command code contained only in the second command sequence, and output a second internal command signal corresponding to the unit internal command signal latched in the common command latching unit and the unit internal command signal latched in the second command latching unit.

2. The command processing circuit of claim 1, wherein the first command latching unit is configured to latch the unit internal command signal corresponding to the unit command code contained only in the first command sequence in response to the unit internal command signal latched in the common command latching unit.

3. The command processing circuit of claim 1, wherein the second command latching unit is configured to latch the unit internal command signal corresponding to the unit command code contained only in the second command sequence in response to the unit internal command signal latched in the common command latching unit.

4. The command processing circuit of claim 1, wherein the common command latching unit comprises:
a latch unit configured to latch the unit internal command signal in response to an internal clock signal; and
an internal clock generating unit configured to generate the internal clock signal corresponding to a first internal clock signal in response to an output signal of the latch unit.

5. The command processing circuit of claim 1, wherein the first command latching unit comprises:
a latch unit configured to latch the unit internal command signal in response to an internal clock signal; and
an internal clock generating unit configured to generate the internal clock signal corresponding to a first internal clock signal in response to an output signal of the latch unit.

6. The command processing circuit of claim 1, wherein the second command latching unit comprises:
a latch unit configured to latch the unit internal command signal in response to an internal clock signal; and an internal clock generating unit configured to generate the internal clock signal corresponding to a first internal clock signal in response to an output signal of the latch unit.

7. The command processing circuit of claim 6, wherein the latch unit comprises:
a first signal transfer unit configured to selectively transfer the unit internal command signal in response to a positive clock of the internal clock signal;
a first latch configured to latch an output signal of the first signal transfer unit in response to a negative clock of the internal clock signal;
a second signal transfer unit configured to selectively transfer an output signal of the first latch in response to the negative clock of the internal clock signal; and
a second latch configured to latch an output signal of the second signal transfer unit in response to the positive clock of the internal clock signal.

8. The command processing circuit of claim 6, wherein the internal clock generating unit comprises:
a first logic configured to perform a NOR operation on the first internal clock signal and the output signal of the latch unit to output the negative clock;
a second logic configured to invert the output signal of the latch unit; and
a third logic configured to perform a NAND operation on an output signal of the first logic and an output signal of the second logic to output the positive clock.

9. A command processing circuit for generating internal command signals corresponding to a plurality of unit internal command signals sequentially applied during a plurality of command cycles, the command processing circuit comprising:
a first command latching unit configured to latch a first unit internal command signal applied in a first command cycle; and
a second command latching unit configured to latch a second unit internal command signal in response to the first unit internal command signal latched in the first command latching unit in a second command cycle after the first command cycle, and output an internal command signal corresponding to the first unit internal command signal and the second unit internal command signal,
wherein the first and second command latching units are configured to latch the unit internal command signals applied in the corresponding command cycles and further configured to not latch a signal applied to the respective latching unit when a predefined signal is in a latched state within the respective latching unit.

10. The command processing circuit of claim 9, wherein the first command latching unit comprises:
a latch unit configured to latch the unit internal command signal in response to an internal clock signal; and
an internal clock generating unit configured to generate the internal clock signal corresponding to a first internal clock signal in response to an output signal of the latch unit.

11. The command processing circuit of claim 10, wherein the latch unit comprises:
a first signal transfer unit configured to selectively transfer the unit internal command signal in response to a positive clock of the internal clock signal;
a first latch configured to latch an output signal of the first signal transfer unit in response to a negative clock of the internal clock signal;

a second signal transfer unit configured to selectively transfer an output signal of the first latch in response to the negative clock of the internal clock signal; and a second latch configured to latch an output signal of the second signal transfer unit in response to the positive clock of the internal clock signal.

12. The command processing circuit of claim 10, wherein the internal clock generating unit comprises:

a first logic configured to perform a NOR operation on the first internal clock signal and the output signal of the latch unit to output the negative clock;

a second logic configured to invert an output signal of the latch unit; and a third logic configured to perform a NAND operation on an output signal of the first logic and an output signal of the second logic to output the positive clock.

13. A phase change memory device, which receives command sequences applied during a plurality of command cycles, the command sequences including a plurality of unit command codes corresponding to a respective command cycle, and generates internal command signals corresponding to the command sequences, the phase change memory device comprising:

a first decoding unit configured to decode unit command codes sequentially applied from outside of the phase memory device to output unit internal command signals corresponding to the unit command codes;

a second decoding unit configured to decode command control codes applied from the outside to output an internal control signal corresponding to the unit command codes; and a command processing unit configured to latch, in response to the internal control signal, unit internal command signals corresponding to those of the unit command codes that are commonly contained in the command sequences, in common command latching units, and latch unit internal command signals corresponding to the unit command sequences contained only in the corresponding command sequences among the plurality of command sequences, in command latching units allocated to the corresponding command sequences, and output the plurality of internal command signals corresponding to the signals latched in the common command latching units and the signals latched in the command latching units allocated to the command sequences.

14. The phase change memory device of claim 13, wherein the common command latching unit and the command latching units of the command processing unit are configured to latch the unit internal command signals applied during the corresponding command cycles and further configured to not latch a signal applied to the respective latching unit when a predefined signal is in a latched state within the respective latching unit.

15. The phase change memory device of claim 13, further comprising a reset signal generating unit configured to generate a reset signal for resetting the command processing unit in response to the internal control signal and the unit internal command signal outputted from the first decoding unit.

16. The phase change memory device of claim 13, wherein the unit command codes are applied through address channels and data channels.

17. The phase change memory device of claim 13, wherein the command control codes are applied through control channels.

18. The phase change memory device of claim 17, wherein the command control codes comprise a chip enable signal (CE), a write enable signal (WE), an address valid input signal (AVD), and an output enable signal (OE).

19. The phase change memory device of claim 13, wherein the command processing unit comprises:

a common command latching unit configured to latch the unit internal command signals corresponding to those of the unit command codes that are commonly contained in first and second command sequences in response to the internal control signal;

a first command latching unit configured to latch the unit internal command signal corresponding to the unit command code contained only in the first command sequence in response to the internal control signal, and output a first internal command signal corresponding to the unit internal command signal latched in the common command latching unit and the unit internal command signal latched in the first command latching unit; and a second command latching unit configured to latch the unit internal command signal corresponding to the unit command code contained only in the second command sequence in response to the internal control signal, and output a second internal command signal corresponding to the unit internal command signal latched in the common command latching unit and the unit internal command signal latched in the second command latching unit.

20. The phase change memory device of claim 19, wherein the first command latching unit is configured to latch the unit internal command signal corresponding to the unit command code contained only in the first command sequence in response to the internal control signal and the unit internal command signal latched in the common command latching unit.

21. The phase change memory device of claim 19, wherein the second command latching unit is configured to latch the unit internal command signal corresponding to the unit command code contained only in the second command sequence in response to the internal control signal and the unit internal command signal latched in the common command latching unit.

22. The phase change memory device of claim 19, wherein the common command latching unit comprises:

a latch unit configured to latch the unit internal command signal in response to the internal clock signal; and an internal clock generating unit configured to generate the internal clock signal corresponding to the internal control signal in response to an output signal of the latch unit.

23. The phase change memory device of claim 19, wherein the first command latching unit comprises:

a latch unit configured to latch the unit internal command signal in response to the internal clock signal; and an internal clock generating unit configured to generate the internal clock signal corresponding to the internal control signal in response to an output signal of the latch unit.

24. The phase change memory device of claim 19, wherein the second command latching unit comprises:

a latch unit configured to latch the unit internal command signal in response to the internal clock signal; and an internal clock generating unit configured to generate the internal clock signal corresponding to the internal control signal in response to an output signal of the latch unit.

25. The phase change memory device of claim 24, wherein the latch unit comprises:

a first signal transfer unit configured to selectively transfer the unit internal command signal in response to a positive clock of the internal clock signal;
a first latch configured to latch an output signal of the first signal transfer unit in response to a negative clock of the internal clock signal;
a second signal transfer unit configured to selectively transfer an output signal of the first latch in response to the negative clock of the internal clock signal; and
a second latch configured to latch an output signal of the second signal transfer unit in response to the positive clock of the internal clock signal.

26. The phase change memory device of claim 24, wherein the internal clock generating unit comprises:
a first logic configured to perform a NOR operation on the internal control signal and the output signal of the latch unit to output the negative clock;
a second logic configured to invert the output signal of the latch unit; and
a third logic configured to perform a NAND operation on an output signal of the first logic and an output signal of the second logic to output the positive clock.

* * * * *